United States Patent
Kim

(10) Patent No.: US 7,371,653 B2
(45) Date of Patent: May 13, 2008

(54) METAL INTERCONNECTION STRUCTURE OF SEMICONDUCTOR DEVICE AND METHOD OF FORMING THE SAME

(75) Inventor: Sang Kwon Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/019,267

(22) Filed: Dec. 23, 2004

(65) Prior Publication Data

US 2005/0136651 A1   Jun. 23, 2005

(30) Foreign Application Priority Data

Dec. 23, 2003   (KR) .................. 10-2003-0095854

(51) Int. Cl.
*H01L 29/51* (2006.01)
*H01L 21/28* (2006.01)

(52) U.S. Cl. .................. 438/422; 438/421; 438/619

(58) Field of Classification Search ................ 438/421, 438/422, 619

See application file for complete search history.

(56) References Cited

U.S. PATENT DOCUMENTS 6,555,467 B2 * 4/2003 Hsu et al. .................. 438/633
6,861,332 B2 * 3/2005 Park et al. .................. 438/421
6,930,034 B2 * 8/2005 Colburn et al. ............. 438/619
2003/0127740 A1   7/2003 Hsu et al.

FOREIGN PATENT DOCUMENTS

JP   2002-353304   12/2002

* cited by examiner

*Primary Examiner*—Zandra V. Smith
*Assistant Examiner*—Pamela E Perkins
(74) *Attorney, Agent, or Firm*—Lowe Hauptman Ham & Berner LLP

(57) ABSTRACT

Provided is a metal interconnection structure of a semiconductor device, having: a lower metal layer disposed on an insulating layer formed on a semiconductor device; a contact plug disposed on the lower metal layer; a supporting layer disposed to surround the contact plug; an upper metal layer disposed on the contact plug and the supporting layer; and an air layer interposed between the lower and upper metal layers to insulate the lower metal layer from the upper metal layer.

6 Claims, 4 Drawing Sheets

METAL INTERCONNECTION STRUCTURE OF SEMICONDUCTOR DEVICE AND METHOD OF FORMING THE SAME

BACKGROUND OF THE INVENTION

1. Field of the Invention

The present invention relates to a metal interconnection structure of a semiconductor device and a method of forming the same.

2. Description of the Related Art

As semiconductor devices become more highly integrated, metal lines become increasingly multi-layered. Therefore, metal interconnection structures and the methods of forming the metal interconnection structures have been actively researched and developed in order to improve performance of the semiconductor devices.

FIG. 1 is a cross sectional view for explaining an example of a conventional method of manufacturing a metal interconnection structure.

Referring to FIG. 1, an interlayer insulating layer 102 is formed on a semiconductor substrate 101. Next, a contact hole 103 is formed to penetrate the interlayer insulating layer 102 and expose an active region of the semiconductor substrate 101. Next, a metal contact 104 is formed to fill the contact hole 103 with a metal layer. Next, an insulating layer 105 is formed on the interlayer insulating layer 102 and the contact hole 103. Next, a trench is formed to penetrate the insulating layer 105 and expose an upper surface of the metal contact 104. Next, a lower metal layer 106 is formed to fill the trench with a metal layer. Next, an inter-metal dielectric layer 107, a via hole 108, a via contact 109, and an upper metal layer 110 are formed with the same as the aforementioned steps.

On the other hand, as copper (Cu) lines having excellent electrical characteristics become more popular, techniques for forming metal interconnection structures by using a damascene method have been widely used.

FIG. 2 is a cross sectional view showing a metal interconnection structure formed by using the damascene method.

Referring to FIG. 2, an insulating layer 202 is formed on an underlying layer 201. Next, a trench 203 is formed by removing a portion of an upper portion of the insulating layer 202. Next, a contact hole 204 having a narrower width than the trench 203 is formed to penetrate the insulating layer 202 from the bottom surface of the trench 205. Next, an insulating layer 206 is formed on the insulating layer 202 and the metal layer 205. Next, the trench 203 and the contact hole 204 are filled with a lower metal layer 205, and then, a planarization process is performed. Subsequently, a trench 207 is formed by removing a portion of an upper portion of the insulating layer 206. Next, a contact hole 208 having a narrow width than the trench 207 is formed to penetrate the insulating layer 206 from the bottom surface of the trench 207. Next, the trench 207 and the contact hole 208 are filled with an upper metal layer 209, and then, a planarization process is performed.

By using the damascene method, Cu metal lines having excellent electrical characteristics can be easily implemented. On the other hand, in order to improve characteristics of the semiconductor devices, techniques of using an insulating layer having a low dielectric constant to insulate the lower metal layer 205 from the upper metal layer 209 have been researched and developed.

Currently, an insulating layer having a dielectric constant of about 2.0 to 3.0 has been researched. However, in a metal interconnection structure using the insulating layer having a low dielectric constant and a method of forming the metal interconnection structure, there are various problems. Therefore, it is expected that it takes a relatively long time to implement a practical metal interconnection structure using the insulating layer having a low dielectric constant.

SUMMARY OF THE INVENTION

In order to solve the aforementioned and other problems, an object of the present invention is to provide a metal interconnection structure of a semiconductor device where lower and upper metal layers are insulated by an ideal insulating layer having the lowest dielectric constant.

Another object of the present invention is to provide a method of forming a metal interconnection structure of a semiconductor device where lower and upper metal layers are insulated by an insulating layer having a low dielectric constant.

In order to achieve this and other benefits of the present invention, according to an aspect of the present invention, there is provided a metal interconnection structure of a semiconductor device, having: a lower metal layer disposed on an insulating layer formed on a semiconductor device; a contact plug disposed on the lower metal layer; a supporting layer disposed to surround the contact plug; an upper metal layer disposed on the contact plug and the supporting layer; and an air layer interposed between the lower and upper metal layers to insulate the lower metal layer from the upper metal layer.

According to another aspect of the present invention, there is provided a method of forming a metal interconnection structure of a semiconductor device, including steps of: forming an lower metal layer on an interlayer insulating layer formed on a semiconductor substrate; forming a first organic layer to cover the interlayer insulating layer and the lower metal layer; forming a supporting layer on the first organic layer, the supporting layer having a hole to expose a portion of a surface of the first organic layer; forming a second organic layer on the supporting layer and the first organic layer; forming an etching stopper layer on the second organic layer; forming a mask layer pattern on the etching stopper layer, the mask layer pattern having an opening exposing a portion of a surface of the etching stopper layer; performing an etching process by using the mask layer pattern as an etching mask to remove the exposed portion of the etching stopper layer; forming a trench in the second organic layer and a via hole in the first organic layer by removing the exposed portion of the second organic layer to expose a portion of the first organic layer and subsequently removing the exposed portion of the first organic layer; forming a metal layer to fill the trench and via hole; forming a contact plug filling the via hole and an upper metal layer filling the trench by performing a planarization process until a surface of the etching stopper layer is exposed, exposing the second organic layer by removing the etching stopper layer; and sequentially removing the first and second organic layers.

In this aspect of the present invention, the first and second organic layers may be photoresist layers.

In addition, the step of sequentially removing the first and second organic layers may be performed by using exposure and developing processes of photolithography.

In addition, the supporting layer may be a nitride layer.

In addition, the etching stopper layer may be a nitride layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Now, exemplary embodiments of the present invention will be described with reference to the attached drawings. However, the present invention can be embodied in various modifications and thus is not limited to the embodiments described below.

Figure 1:
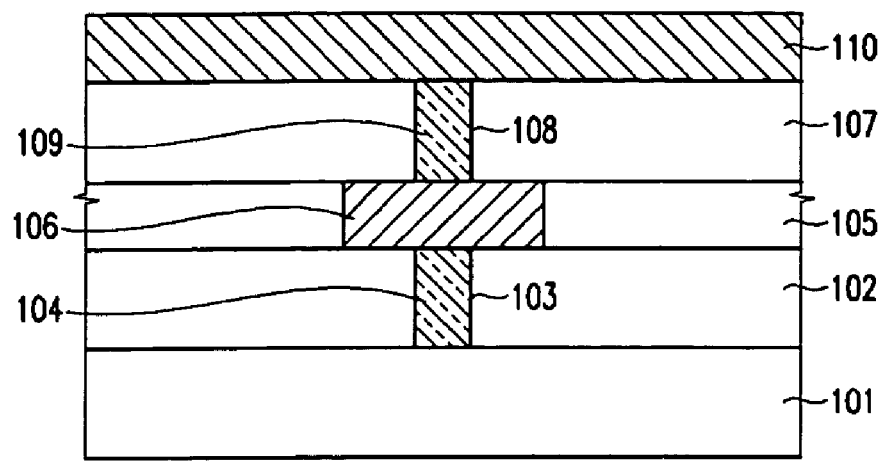
FIG. 1 is a cross sectional view showing an example of a conventional metal interconnection structure.
Figure 2:
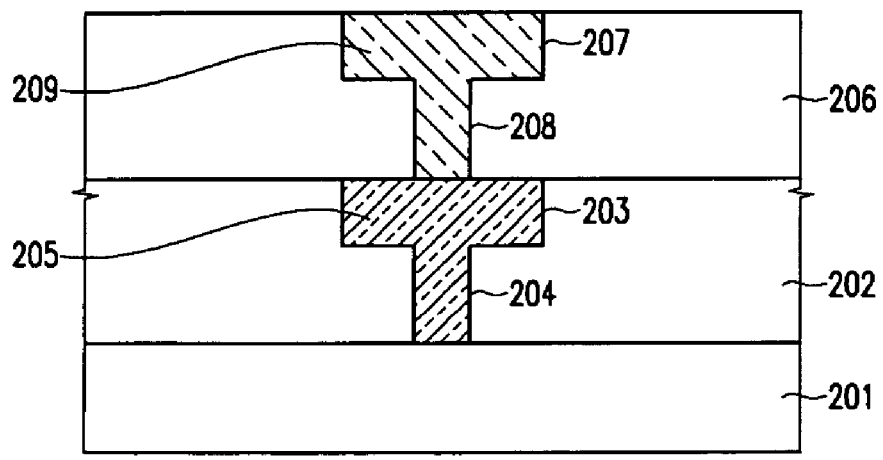
FIG. 2 is a cross sectional view showing another example of a conventional metal interconnection structure.
Figure 3:
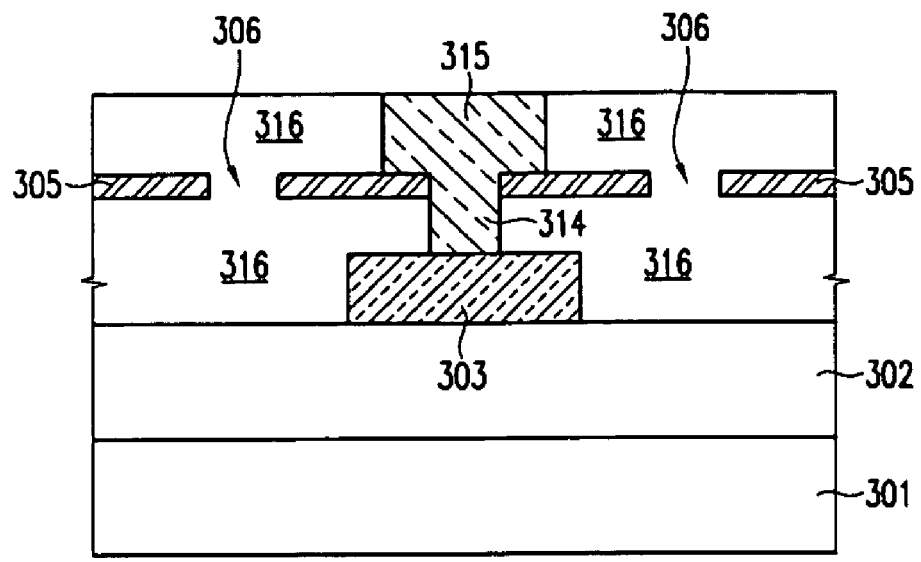
FIG. 3 is a cross sectional view showing an example of a metal interconnection structure according to the present invention.

FIG. 3 is a cross sectional view showing an example of a metal interconnection structure according to the present invention.

Referring to FIG. 3, in the metal interconnection structure according to the present invention, a lower metal layer 303 and an upper metal layer 315 are connected to each other with a contact plug 314. The lower metal layer 303 is insolated from a semiconductor substrate 301 by an interlayer insulating layer 302. Although not shown in the figure, an active region of the semiconductor substrate 301 and the lower metal layer 303 are electrically connected to each other with a metal contact (not shown). In some cases, a plurality of metal lines may be interposed. The contact plug 314 and the upper metal layer 315 are formed by using the same metal layer. The upper metal layer 315 is supported by a supporting layer 305. The supporting layer 305 is a nitride layer. A hole 306 is formed to penetrate the supporting layer 305. An air layer 316 is disposed between the lower metal layer 303 and the upper metal layer 315 to insulate the lower metal layer 303 from the upper metal layer 315. In addition, the upper metal layer 315 on the supporting layer 305 is surrounded by the air layer 316. The upper and lower portions of the air layer 316 are connected to each other through the hole 306.

In the metal interconnection structure where the lower metal layer 303 and the upper metal layer 315 are insulated by the air layer 316, since air in the air layer 316 has the lowest dielectric constant (=1), characteristics of the metal interconnection structure can be improved. For example, RC delay time of the metal interconnection structure can be reduced; cross-talk can be suppressed; and power consumption is lowered. In consideration that currently-used low dialectic materials have a dielectric constant of about 2.0 to 3.0, it can be appreciated that characteristics of the metal interconnection structure can be improved by using the air layer 316 as an insulating layer.

FIGS. 4 to 8 are cross sectional views for explaining a method of forming the metal interconnection structure according to the present invention.

Figure 4:
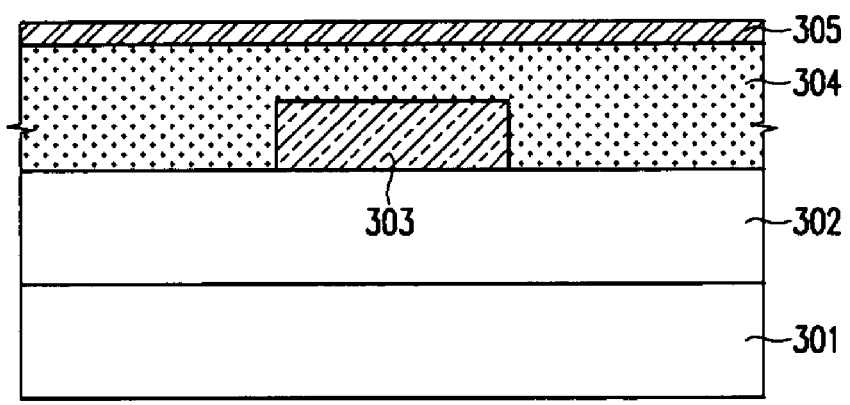
FIGS. 4 to 8 are cross sectional views for explaining a method of forming the metal interconnection structure according to the present invention.

Referring to FIG. 4, a lower metal layer 303 is formed on an interlayer insulating layer 302 which is formed on a semiconductor substrate 301. In general, the lower metal layer 303 is electrically connected to active regions of the semiconductor substrate 301

Next, a first organic layer 304 is formed on the interlayer insulating layer 302 and the lower metal layer 303. The first organic layer 304 may be a photoresist layer. Next, a supporting layer 305 is formed on the first organic layer 304. The supporting layer 305 may be a nitride layer.

Figure 5:
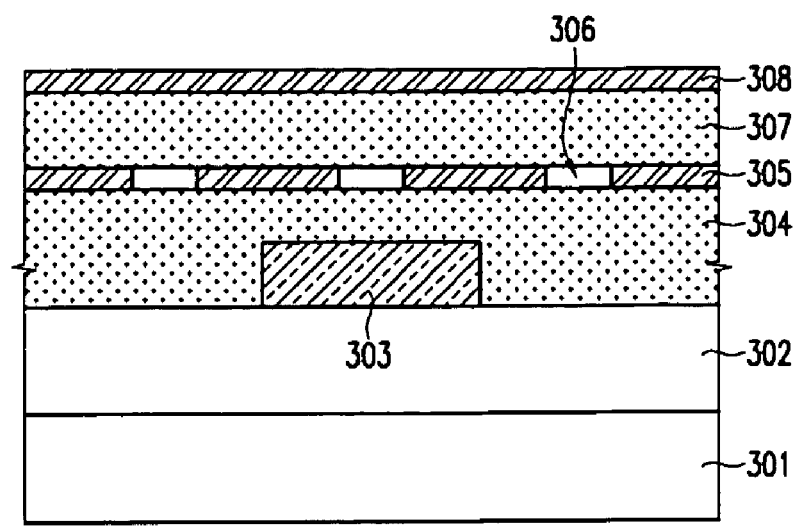

Referring to FIG. 5, a portion of the supporting layer 305 is removed by performing an etching process using a predetermined mask layer pattern (not shown) as an etching mask. As a result, a hole 306 is formed to penetrate the supporting layer 305 and expose a portion of a surface of the first organic layer 304. After the hole 306 is formed, the mask layer pattern is removed.

Next, a second organic layer 307 is formed on the exposed surfaces of the supporting layer 305 and the first organic layer 304. The second organic layer 307 may be photoresist layer.

Next, an etching stopper layer 308 is formed on the second organic layer 307. The etching stopper layer 308 is used as an etching stopper in the subsequent planarization process. The etching stopper layer 308 may be a nitride layer.

Figure 6:
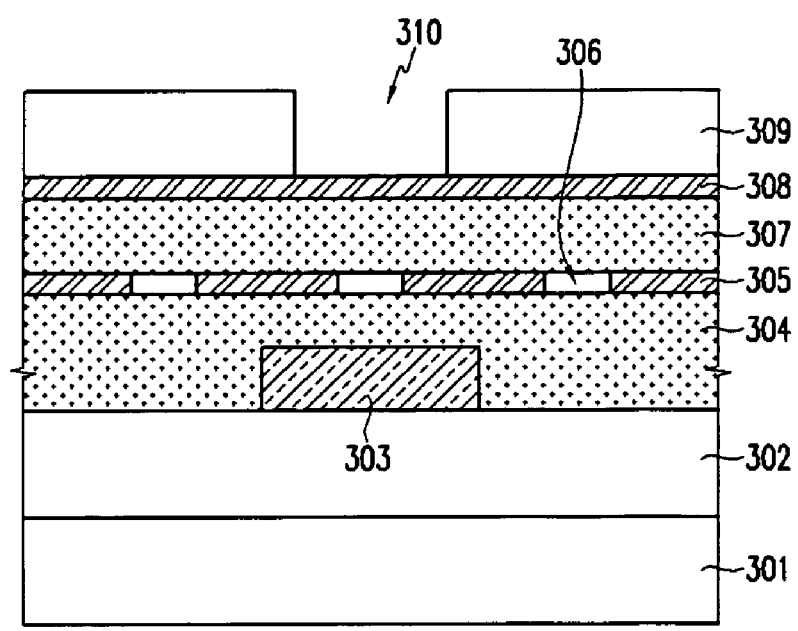

Referring to FIG. 6 a mask layer pattern 309 is formed on the etching stopper layer 308. The mask layer pattern 309 has an opening 310 for exposing a portion of a surface of the etching stopper layer 308 on the second organic layer 307. Under the exposed portion of the surface of the second organic layer 307, an upper metal layer is formed by the following process.

Next, the exposed portion of the second organic layer 307 is obtained by performing an etching process using the mask layer pattern 309 as an etching mask.

Figure 7:
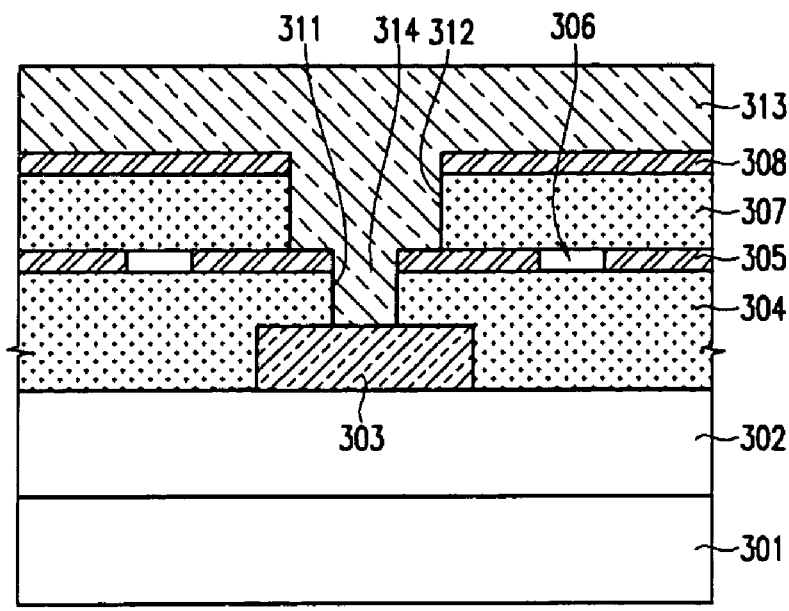

Referring to FIG. 7, by performing an organic material removing process, the second organic layer 307 exposed by the mask layer pattern 309 is removed. Next, the first organic layer 304 exposed by the hole 306 penetrating the supporting layer 305 is removed. As a result, at the lower portion, a via hole 311 is formed to expose a portion of a surface of the lower metal layer 303; and at the upper portion, a trench 312 is formed to be filled with the upper metal layer.

In a case where the first and second organic layer 304 and 307 are photoresist layers, the organic material removing process is performed by using exposure and developing processes of photolithography.

Next, by forming a metal layer 313 on the entire surface, a contact hole 314 is formed to fill the via hole 311.

Figure 8:
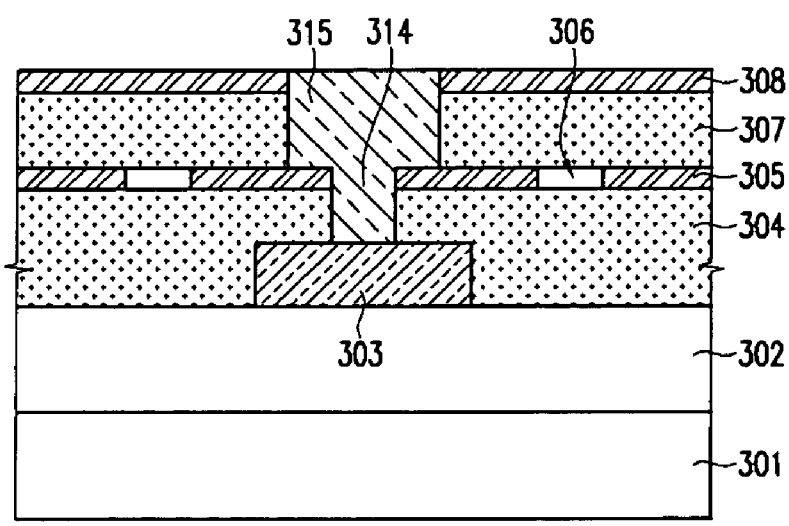

Referring to FIG. 8, a planarization process is performed on the resultant product of FIG. 7 to form the upper metal layer 315 on the contact hole 314. The planarization process may be performed by using a chemical mechanical polishing (CMP) process. The planarization process is performed until a top upper surface of the supporting layer 305 is exposed.

Next, the exposed etching stopper layer 308 is removed; and the second organic layer 307 and the first organic layer 304 are sequentially removed. As a result, the metal interconnection structure shown in FIG. 3 is obtained. In the metal interconnection structure, the first and second organic layer 304 and 307 are insulated by the air layer 316. The first and second organic layer 304 and 307 may be removed by using a plasma process.

According to a metal interconnection structure of a semiconductor of the present invention, since an air layer (an ideal dielectric material) is used as an insulating layer between lower and upper metal layers, it is possible to reduce RC delay time, cross-talk, and power consumption.

In addition, according to a method of forming a metal interconnection structure of a semiconductor of the present invention, since organic material layers are used, it is possible to easily implement the metal interconnection structure.

The present application contains subject matter related to that disclosed in Korean priority application No 10-2003-0095854, filed Dec. 23, 2003, the entire contents of which being incorporated herein by reference.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of forming a metal interconnection structure of a semiconductor device, comprising steps of:
    forming a lower metal layer on an interlayer insulating layer formed on a semiconductor substrate;
    forming a first organic layer to cover the interlayer insulating layer and the lower metal layer;
    forming a supporting layer on the first organic layer;
    forming a hole therethrough to expose a portion of a surface of the first organic layer in the supporting layer by selectively removing a portion of the supporting layer;
    forming a second organic layer on the supporting layer and the first organic layer;
    forming an etching stopper layer on the second organic layer;
    forming a mask layer pattern on the etching stopper layer, the mask layer pattern having an opening for exposing a portion of a surface of the etching stopper layer;
    performing an etching process by using the mask layer pattern as an etching mask to remove a portion of the etching stopper layer exposed through the etching mask;
    forming a trench in the second organic layer and a via hole in the first organic layer by removing a portion of the second organic layer that is exposed so as to expose a portion of the first organic layer through the hole formed by a step of forming a hole through the supporting layer and subsequently removing the portion of the first organic layer that is exposed through the hole;
    forming a metal layer to fill the trench and via hole;
    forming a contact plug filling the via hole and an upper metal layer filling the trench by performing a planarization process until a surface of the etching stopper layer is exposed; exposing the second organic layer by removing the etching stopper layer; and sequentially removing the first and second organic layers.

2. The method of claim 1, wherein the first and second organic layers are photoresist layers.

3. The method of claim 2, wherein the step of sequentially removing the first and second organic layers is performed by a plasma process.

4. The method of claim 1, wherein the supporting layer is a nitride layer.

5. The method of claim 1, wherein the etching stopper layer is a nitride layer.

6. A method of forming a metal interconnection structure of a semiconductor device, comprising steps for:
    forming a lower metal layer on an interlayer insulating layer formed on a semiconductor substrate;
    forming a first organic layer to cover the interlayer insulating layer and the lower metal layer;
    forming a supporting layer on the first organic layer;
    forming a hole therethrough to expose a portion of a surface of the first organic layer in the supporting layer by selectively removing a portion of the supporting layer;
    forming a second organic layer on the supporting layer and the first organic layer;
    forming an etching stopper layer on the second organic layer;
    forming a mask layer pattern on the etching stopper layer, the mask layer pattern having an opening for exposing a portion of a surface of the etching stopper layer;
    performing an etching process by using the mask layer pattern as an etching mask to remove a portion of the etching stopper layer exposed through the etching mask;
    forming a trench in the second organic layer and a via hole in the first organic layer by removing a portion of the second organic layer that is exposed so as to expose a portion of the first organic layer through the hole formed by the step for forming a hole through the supporting layer and subsequently removing the portion of the first organic layer that is exposed through the hole;
    forming a metal layer to fill the trench and via hole;
    forming a contact plug filling the via hole and an upper metal layer filling the trench by performing a planarization process until a surface of the etching stopper layer is exposed; exposing the second organic layer by removing the etching stopper layer; and sequentially removing the first and second organic layers.

* * * * *